United States Patent
Huang et al.

(10) Patent No.: US 7,429,533 B2
(45) Date of Patent: Sep. 30, 2008

(54) PITCH REDUCTION

(75) Inventors: Zhisong Huang, Fremont, CA (US);
Jeffrey Marks, San Jose, CA (US); S. M. Reza Sadjadi, Saratoga, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 11/432,194

(22) Filed: May 10, 2006

(65) Prior Publication Data
US 2007/0264830 A1 Nov. 15, 2007

(51) Int. Cl.
*H01L 21/311* (2006.01)
*H01L 21/306* (2006.01)

(52) U.S. Cl. .................. 438/694; 438/695; 438/723; 438/725

(58) Field of Classification Search .................. 438/694, 438/695, 723, 725
See application file for complete search history.

(56) References Cited

U.S. PATENT DOCUMENTS

| | | | |
|---|---|---|---|
| 2003/0170998 A1* | 9/2003 | Mise et al. | 438/710 |
| 2004/0087114 A1* | 5/2004 | Xiang et al. | 438/478 |
| 2004/0161946 A1* | 8/2004 | Tsai et al. | 438/778 |
| 2005/0048785 A1 | 3/2005 | Kang et al. | |
| 2006/0068596 A1* | 3/2006 | Dobuzinsky et al. | 438/740 |
| 2006/0172540 A1 | 8/2006 | Marks et al. | |
| 2006/0249784 A1* | 11/2006 | Black et al. | 257/327 |
| 2006/0263540 A1* | 11/2006 | Ramaswamy et al. | 427/569 |
| 2007/0026682 A1* | 2/2007 | Hochberg et al. | 438/710 |
| 2007/0099431 A1 | 5/2007 | Li | |

FOREIGN PATENT DOCUMENTS

| | | |
|---|---|---|
| WO | WO 02/056358 A | 7/2002 |
| WO | WO 2004/034445 A | 4/2004 |
| WO | WO 2007/064499 A | 6/2007 |

OTHER PUBLICATIONS

Written Opinion dated Oct. 31, 2007 for related International Patent Application No. PCT/US2007/010508.

* cited by examiner

*Primary Examiner*—Nadine Norton
*Assistant Examiner*—Mahmoud Dahimene
(74) *Attorney, Agent, or Firm*—Beyer Law Group LLP

(57) ABSTRACT

A method for providing features in an etch layer is provided. A sacrificial patterned layer with sacrificial features is provided over an etch layer. Conformal sidewalls are formed in the sacrificial features, comprising at least two cycles of a sidewall formation process, wherein each cycle comprises a sidewall deposition phase and a sidewall profile shaping phase. Parts of the sacrificial patterned layer between conformal sidewalls are removed leaving the conformal sidewalls with gaps between the conformal sidewalls where parts of the sacrificial patterned layer were selectively removed. Features are etched in the etch layer using the conformal sidewalls as an etch mask, wherein the features in the etch layer are etched through the gaps between the conformal sidewalls where parts of the sacrificial patterned layer were selectively removed.

20 Claims, 16 Drawing Sheets

PITCH REDUCTION

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. The photoresist patterns have a critical dimension (CD), which may be the width of the smallest feature. Due to optical properties dependent on wavelength, photoresist exposed by longer wavelength light has larger theoretical minimal critical dimensions. Features are etched through the photoresist pattern. Ideally, the CD of the features (the width of the features) is equal to the CD of the feature in the photoresist. In practice, the CD of the feature may be larger than the CD of the photoresist due to faceting, erosion of the photoresist, or undercutting. The feature may also be tapered, where the CD of the feature is at least as great as the CD of the photoresist, but where the feature tapers to have a smaller width near the feature bottom. Such tapering may provide unreliable features.

In order to provide features with smaller CD, features formed using shorter wavelength light are being pursued. 193 nm photoresist is exposed by 193 nm light. Using phase shift reticles and other technology, a 90-100 nm CD photoresist pattern may be formed, using 193 nm photoresist. This would be able to provide a feature with a CD of 90-100 nm. 157 nm photoresist is exposed by 157 nm light. Using phase shift reticles and other technology, sub 90 nm CD photoresist patterns may be formed. This would be able to provide a feature with a sub 90 nm CD.

The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist and 157 nm photoresist may not have selectivities as high as longer wavelength photoresists and may more easily deform under plasma etch conditions.

In the etching of conductive layers, such as in the formation of memory devices, it is desirable to increase device density. Such memory devices may have an array or cell region where the memory arrays are located and a peripheral or logic region where logic devices are placed to control the memory arrays. Generally, it may be desirable for the density of devices in the peripheral or logic region to be lower than the density of devices in the array or cell region.

SUMMARY OF THE INVENTION

To achieve the foregoing and in accordance with the purpose of the present invention a method for providing features in an etch layer is provided. A sacrificial patterned layer with sacrificial features is provided over an etch layer. Conformal sidewalls are formed in the sacrificial features, comprising at least two cycles of a sidewall formation process, wherein each cycle comprises a sidewall deposition phase and a sidewall profile shaping phase. Parts of the sacrificial patterned layer between conformal sidewalls are removed leaving the conformal sidewalls with gaps between the conformal sidewalls where parts of the sacrificial patterned layer were selectively removed. Features are etched in the etch layer using the conformal sidewalls as an etch mask, wherein the features in the etch layer are etched through the gaps between the conformal sidewalls where parts of the sacrificial patterned layer were selectively removed.

In another manifestation of the invention a method for providing features in an etch layer is provided. A sacrificial patterned layer with sacrificial features is provided over an etch layer, wherein the sacrificial patterned layer defines an array region and a logic region. The logic region of the sacrificial patterned layer is covered, wherein parts of the sacrificial patterned layer defining the array region are uncovered. Conformal sidewalls are formed in the sacrificial features, comprising at least two cycles of a sidewall formation process, wherein each cycle comprises a sidewall deposition phase comprising providing a deposition gas, forming a plasma from the deposition gas, and stopping the flow of the deposition gas and a sidewall profile shaping phase comprising providing a profile shaping gas different than the deposition gas, forming a plasma from the profile shaping gas, and stopping the flow of the profile shaping gas. Uncovered parts of the sacrificial patterned layer between conformal sidewalls are selectively removed leaving the conformal sidewalls with gaps between the conformal sidewalls where parts of the sacrificial patterned layer were selectively removed. The logic region of the sacrificial patterned layer is uncovered. Features are etched in the etch layer using the conformal sidewalls as an etch mask, wherein the features in the etch layer are etched through the gaps between the conformal sidewalls where parts of the sacrificial patterned layer were selectively removed.

In another manifestation of the invention an apparatus for forming features in an etch layer is provided. A plasma processing chamber is provided. The plasma processing chamber comprises a chamber wall forming a plasma processing chamber enclosure, substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, gas inlet for providing gas into the plasma processing chamber enclosure, and a gas outlet for exhausting gas from the plasma processing chamber enclosure. A gas source is in fluid connection with the gas inlet. The gas source comprises a sidewall deposition gas source, a sidewall profile shaping gas source, a sacrificial layer removal gas source, and an etch layer etching gas source. A controller is controllably connected to the gas source and the at least one electrode. The controller comprises at least one processor and computer readable media. The computer readable media comprises computer readable code for forming a sacrificial patterned layer with sacrificial features over an etch layer, wherein the sacrificial patterned layer defines an array region and a logic region, computer readable code for forming conformal sidewalls in the sacrificial features, which comprises at least two cycles of a sidewall formation process, wherein each cycle comprises computer readable code for performing a sidewall deposition phase, comprising computer readable code for providing a deposition gas. computer readable code for forming a plasma from the deposition gas, and computer readable code for stopping the flow of the deposition gas, and computer readable code for providing a sidewall profile shaping phase, comprising computer readable code for providing a profile shaping gas different than the deposition gas, computer readable code for forming a plasma from the profile shaping gas, and computer readable code for stopping the flow of the profile shaping gas, computer readable code for selectively removing parts of the sacrificial patterned layer between conformal sidewalls leaving the conformal sidewalls with gaps between the conformal sidewalls where parts of the sacrificial patterned layer were selectively removed, and computer readable code for etching features in the etch layer using the conformal sidewalls as an etch mask, wherein the features in the etch layer are etched through the gaps between the conformal sidewalls where parts of the sacrificial patterned layer were selectively removed.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
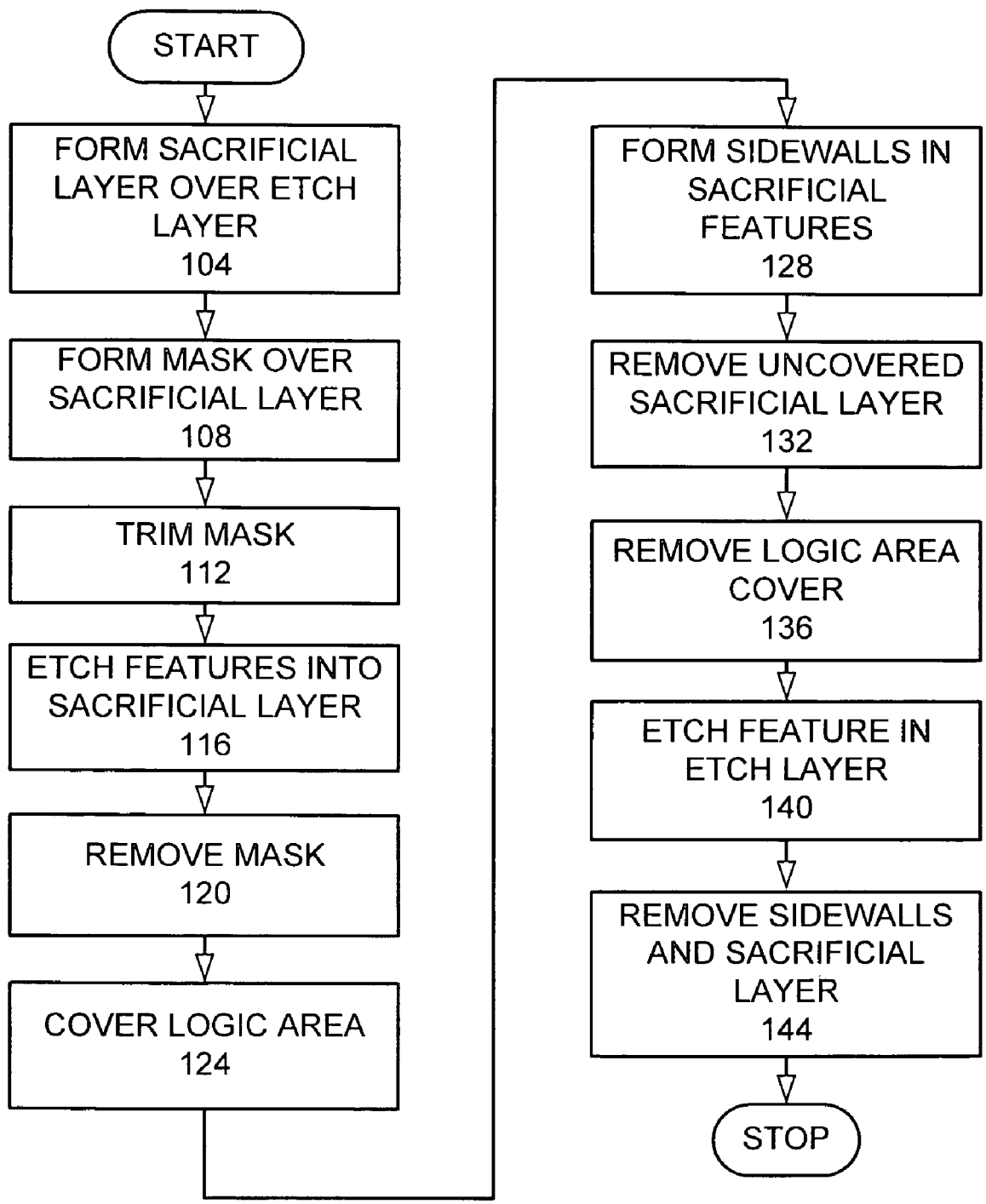
FIG. 1 is a flow chart of a process that may be used in an embodiment of the invention.
Figure 2A:
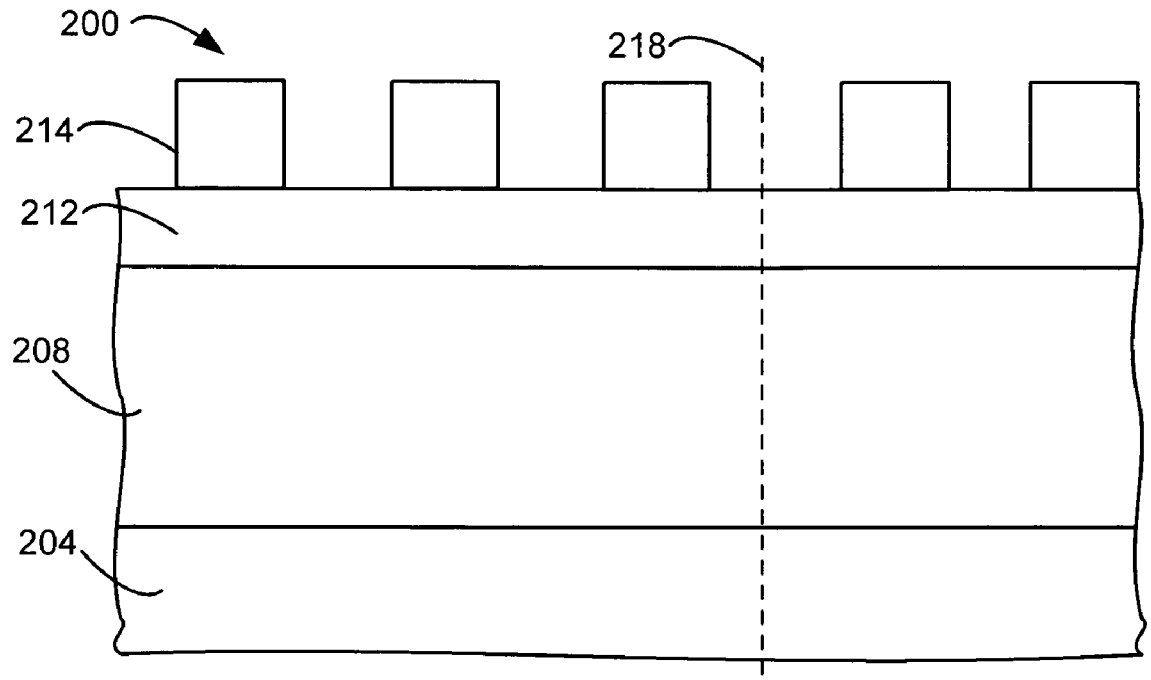
FIGS. 2A-I are schematic cross-sectional and top views of a stack processed according to an embodiment of the invention.

To facilitate understanding, FIG. 1 is a flow chart of a process that may be used in an embodiment of the invention. A sacrificial layer is formed over an etch layer (step 104). FIG. 2A is a cross-sectional view of a sacrificial layer 212 formed over an etch layer 208, which is over a substrate 204 forming a stack 200. In this example, the substrate 204 is a silicon wafer, the sacrificial layer 212 is a hard mask material, such as amorphous carbon, and the etch layer 208 is of a dielectric material, such as $SiO_2$ or SiN which may form a hardmask for etching of a conductor material such as Si.

A mask 214 is formed over the sacrificial layer (step 108), as shown in FIG. 2A. Preferably, the mask 214 is of a photoresist material. In this example, the mask is a 193 nm photoresist material. The substrate 204 is placed in a processing chamber.

Figure 4:
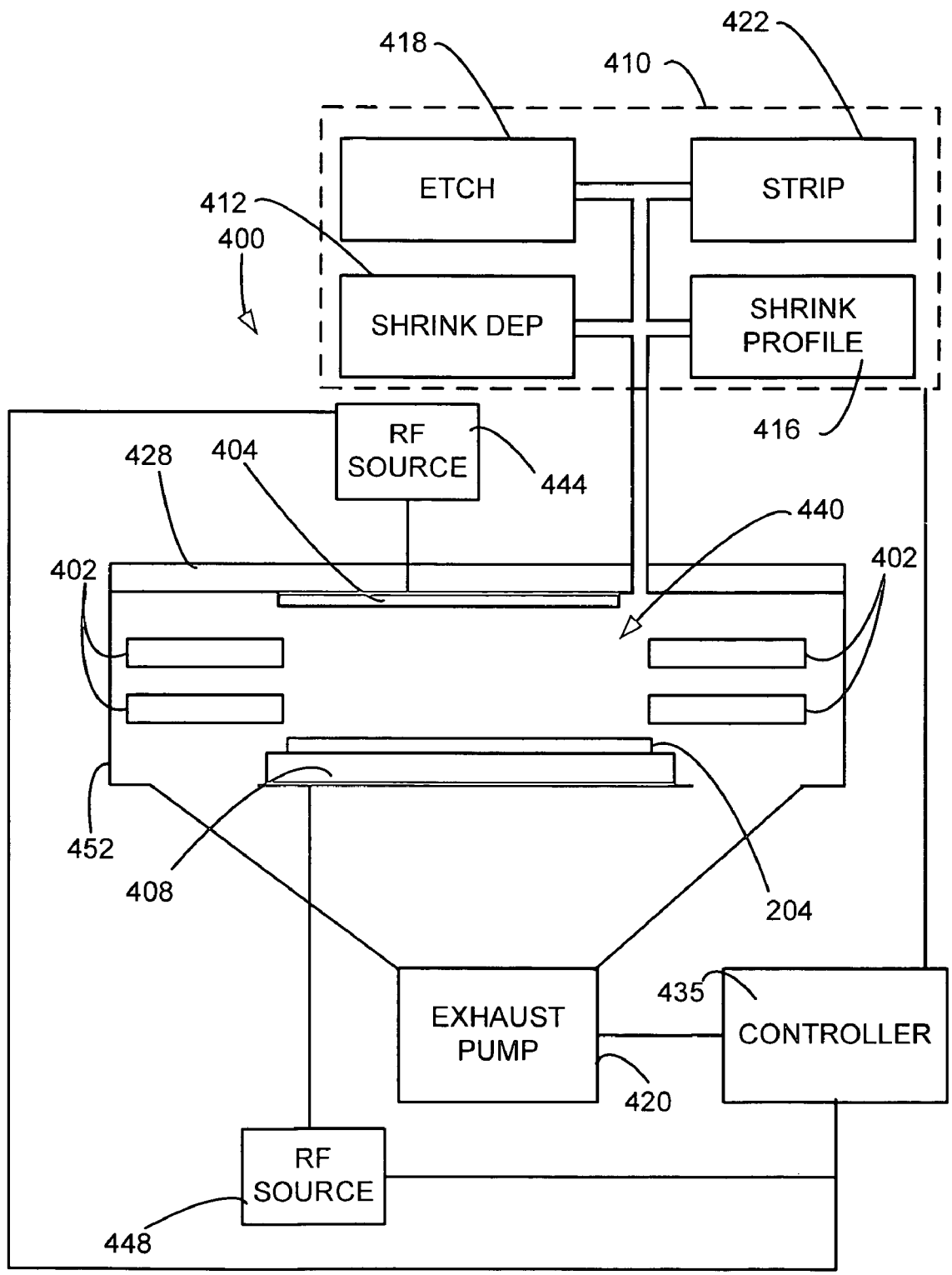
FIG. 4 is a schematic view of a plasma processing chamber that may be used in practicing the invention.

FIG. 4 is a schematic view of a processing chamber 400 that may be used in this embodiment. The plasma processing chamber 400 comprises confinement rings 402, an upper electrode 404, a lower electrode 408, a gas source 410, and an exhaust pump 420. The gas source 410 comprises a shrink deposition gas source 412 and a shrink profile gas source 416. The gas source may comprise additional gas sources such as an etch gas source 418 and a stripping gas source 422 to allow etching, stripping, and other processes to be performed in the same chamber. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume 440. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Lam Research Corporation's Dual Frequency Capacitive (DFC) System, made by LAM Research Corporation™ of Fremont, Calif., which may be used in a preferred embodiment of the invention, both the 27 MHz and 2 MHz power sources make up the second RF power source 448 connected to the lower electrode, and the upper electrode is grounded. In other embodiments, the RF power source may have a frequency up to 300 MHz. A controller 435 is controllably connected to the RF sources 444, 448, exhaust pump 420, and the gas source 410. The DFC System would be used when the layer to be etched 208 is a dielectric layer, such as silicon oxide or organo silicate glass.

Figure 5A:
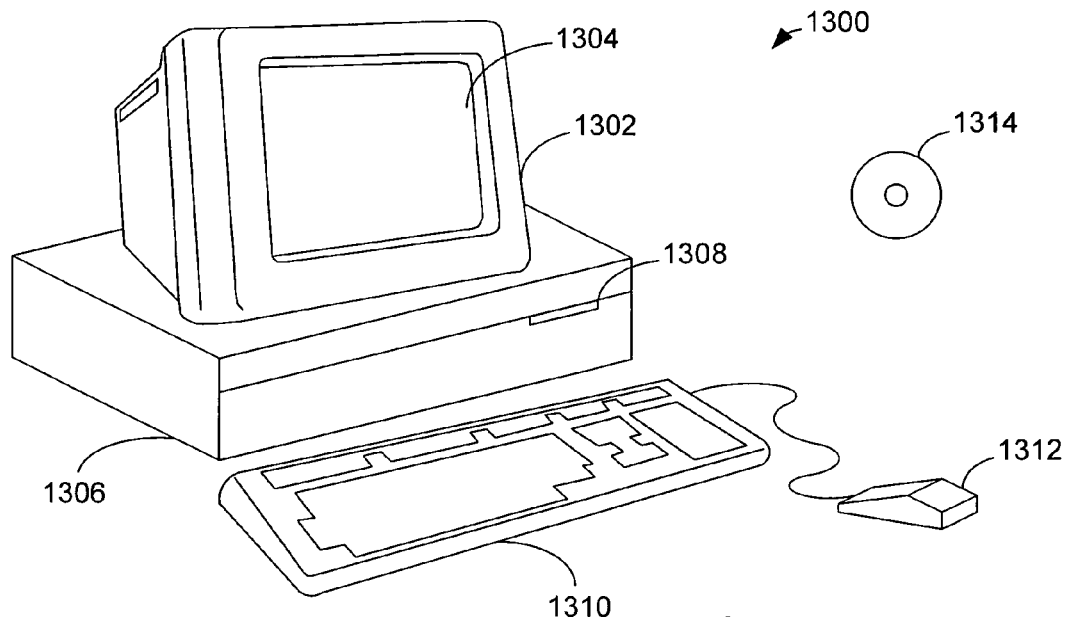
FIGS. 5A-B illustrate a computer system, which is suitable for implementing a controller used in embodiments of the present invention.
Figure 5B:
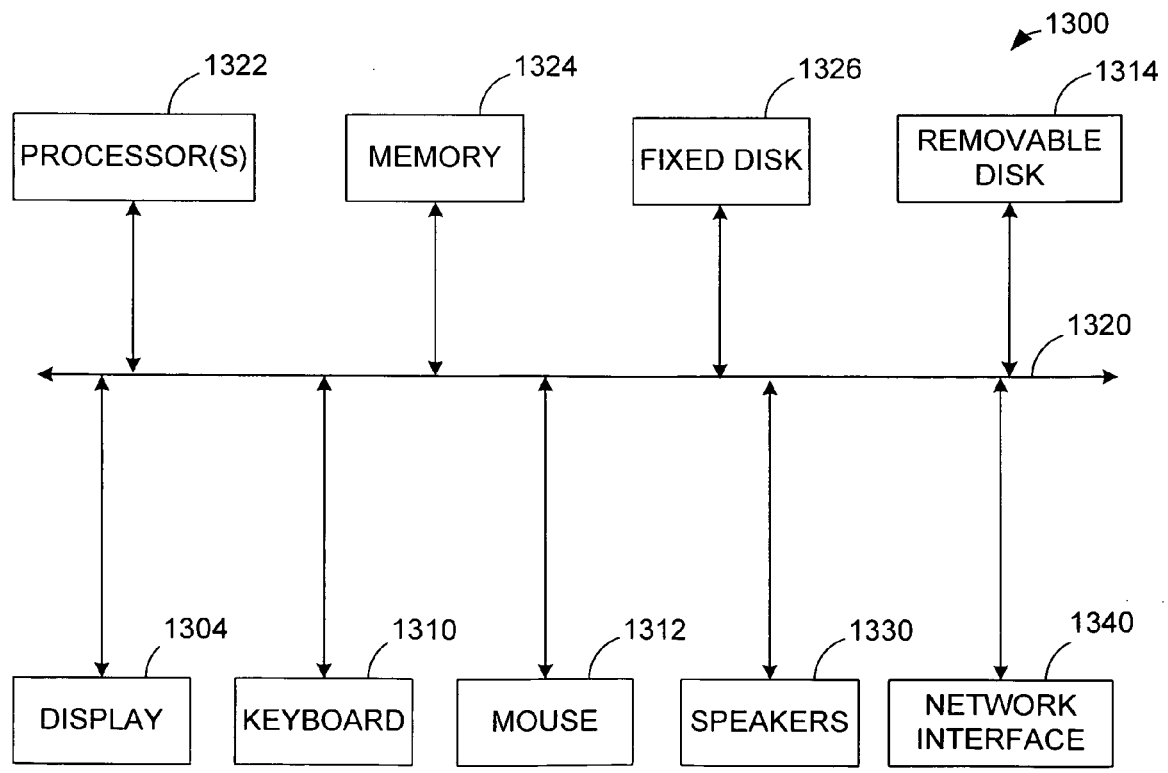

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
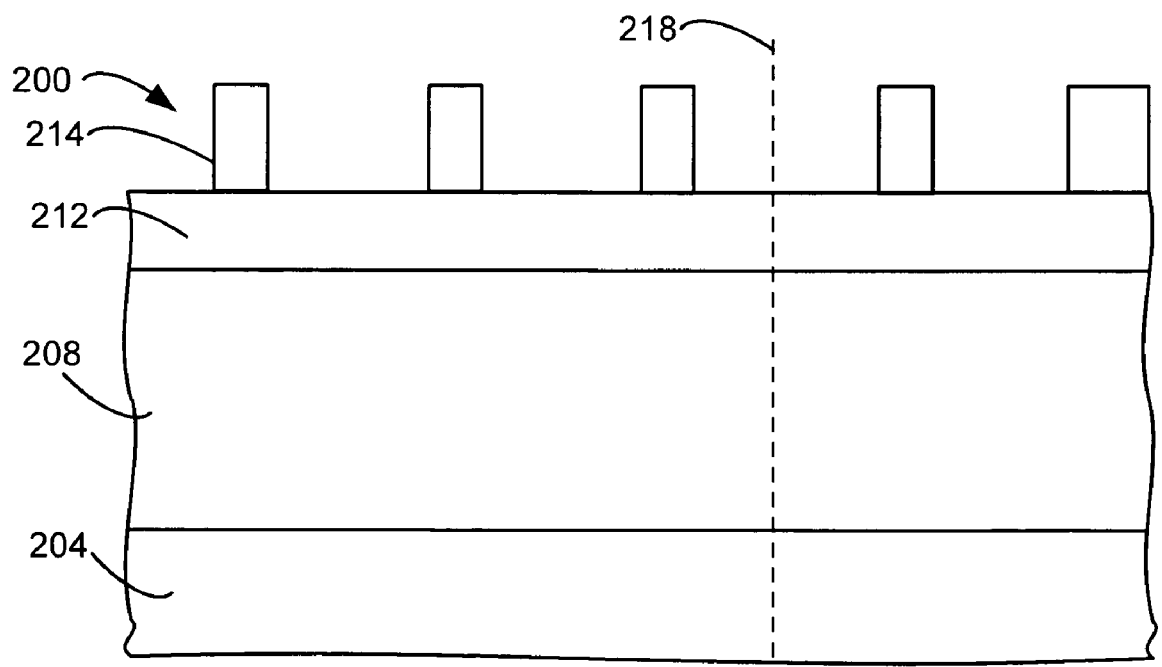

The mask is trimmed (step 112), as shown in FIG. 2B, in that the structures of the mask are made thinner. The trim time is adjusted such that the spacers to be formed subsequently will be placed at the desired position. An example recipe for trimming the mask is an $O_2$-based photoresist trim process uses a recipe with a pressure of 400 mTorr. 200 watts are provided at a frequency of 2 MHz. 1000 sccm of $O_2$ is provided.

Figure 2C:
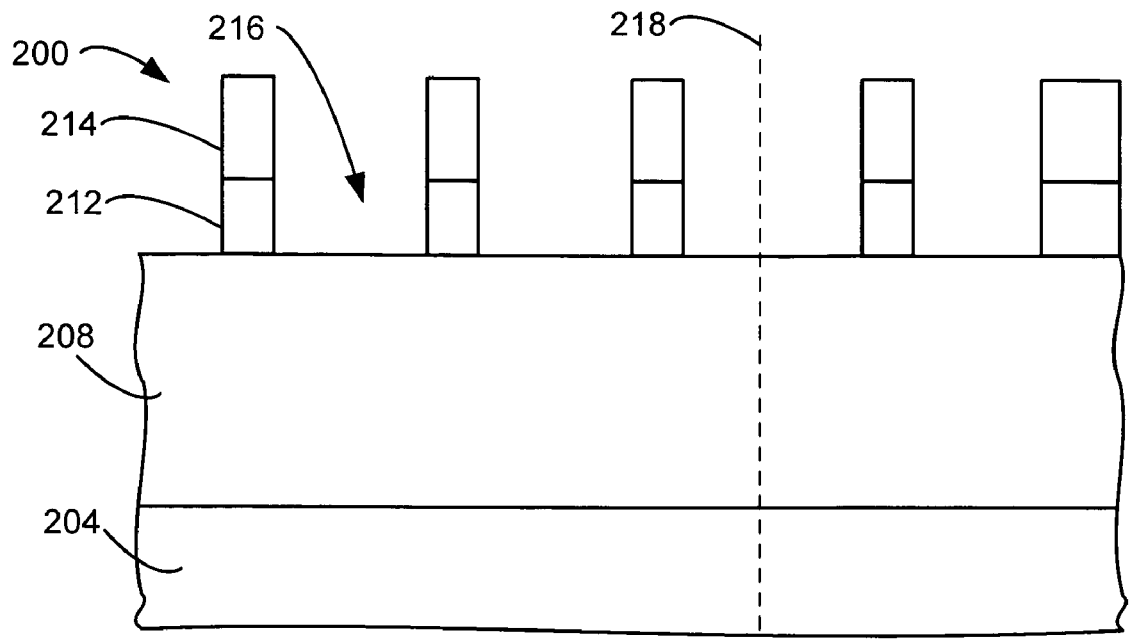

Sacrificial layer features 216 are etched into the sacrificial layer 212 (step 116), as shown in FIG. 2C. An example of a recipe for etching an amorphous carbon sacrificial layer provides a pressure of 40 mTorr. 300 watts are provided at a frequency of 27 MHz. 100 sccm $O_2$ and 10 sccm $SO_2$ are provided. The profile angle of the sacrificial features preferably has a vertical to slightly re-entrant profile to prevent tilting of the subsequent spacer/fin features. Since the profile angle of the exposed side of the sidewall spacers is determined by the profile shaping phase and hence typically slightly tapered, a tapered sacrificial feature would otherwise make the resulting spacer features seem tilted after removal of the sacrificial layer.

Figure 2D:
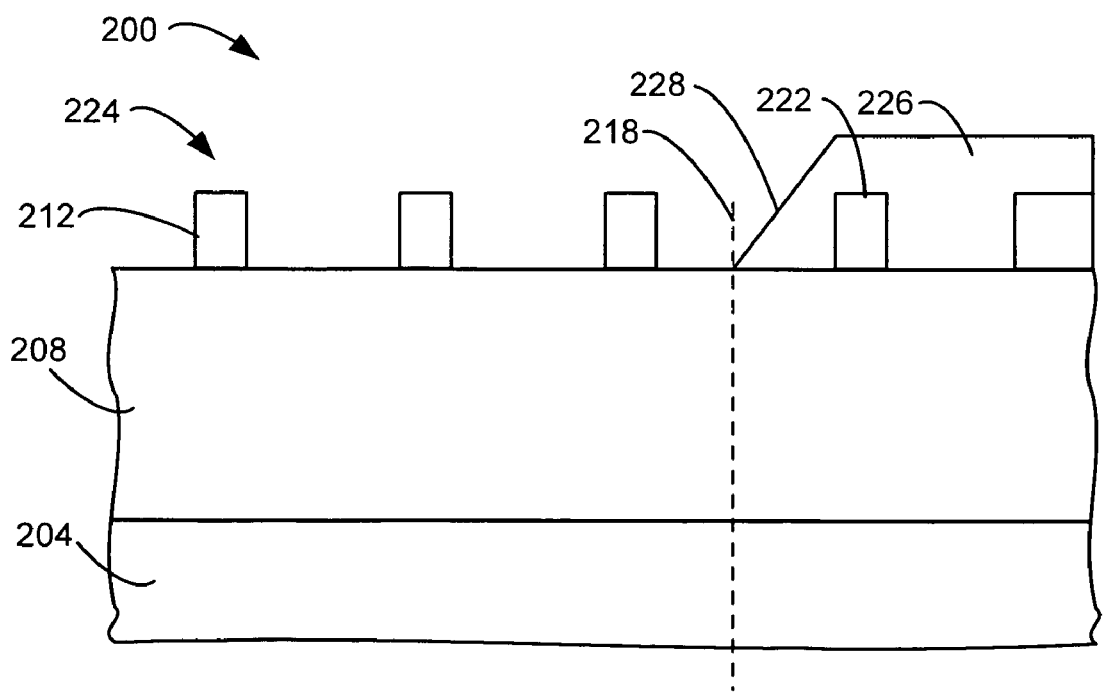

The mask is then removed (step 120), as shown in FIG. 2D. The mask may be removed during the etching of the sacrificial layer features 216 or by a subsequent ashing step using an oxygen ashing that preferably does not undercut the sacrificial materials formed. It may also be removed is a wet solution that is non-reactive towards the sacrificial materials.

In this example, the mask pattern is for forming a memory array chip. In this example, dotted line 218 divides a region for logic devices, such as a peripheral logic device pattern 222 and the remaining chip for an array or cell region 224. In this example, it is desirable to increase the density of the array or cell region, which provides repeatable features, without necessarily increasing the density of the logic or peripheral region. Therefore, in this example, the logic area is covered (step 124). An I-line photoresist is used to create the cover 226. This type of cover can be a low resolution cover. Preferably, the cover 226 has a sloping surface 228, instead of a vertical surface at the edge so that an undesirable spacer can not be formed in the subsequent processes along the edge of this cover.

Figure 2E:
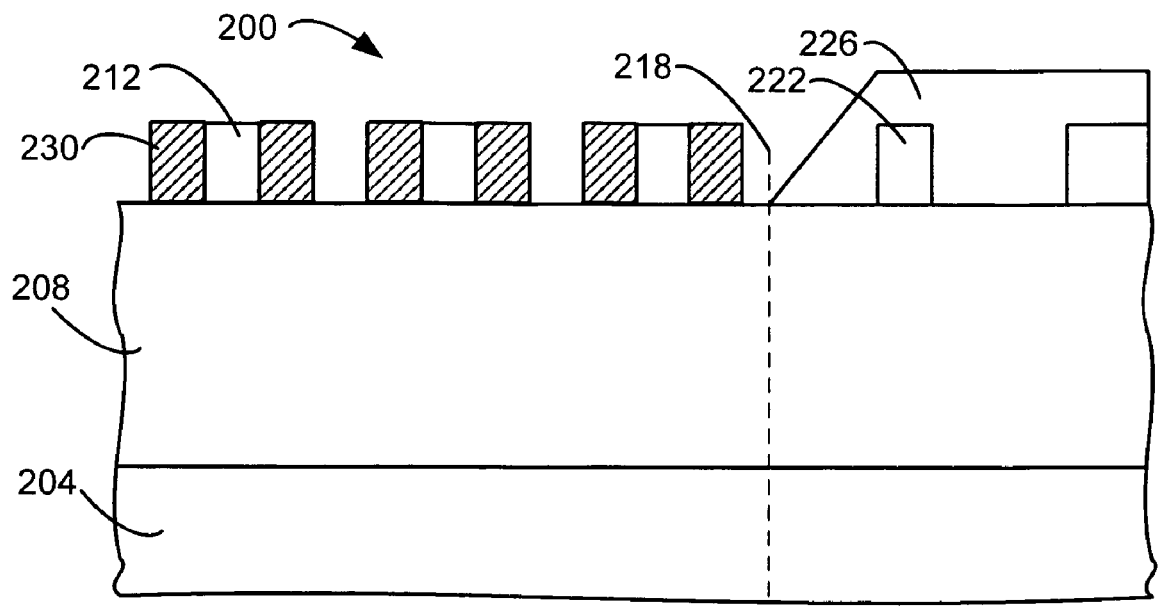
Figure 3:
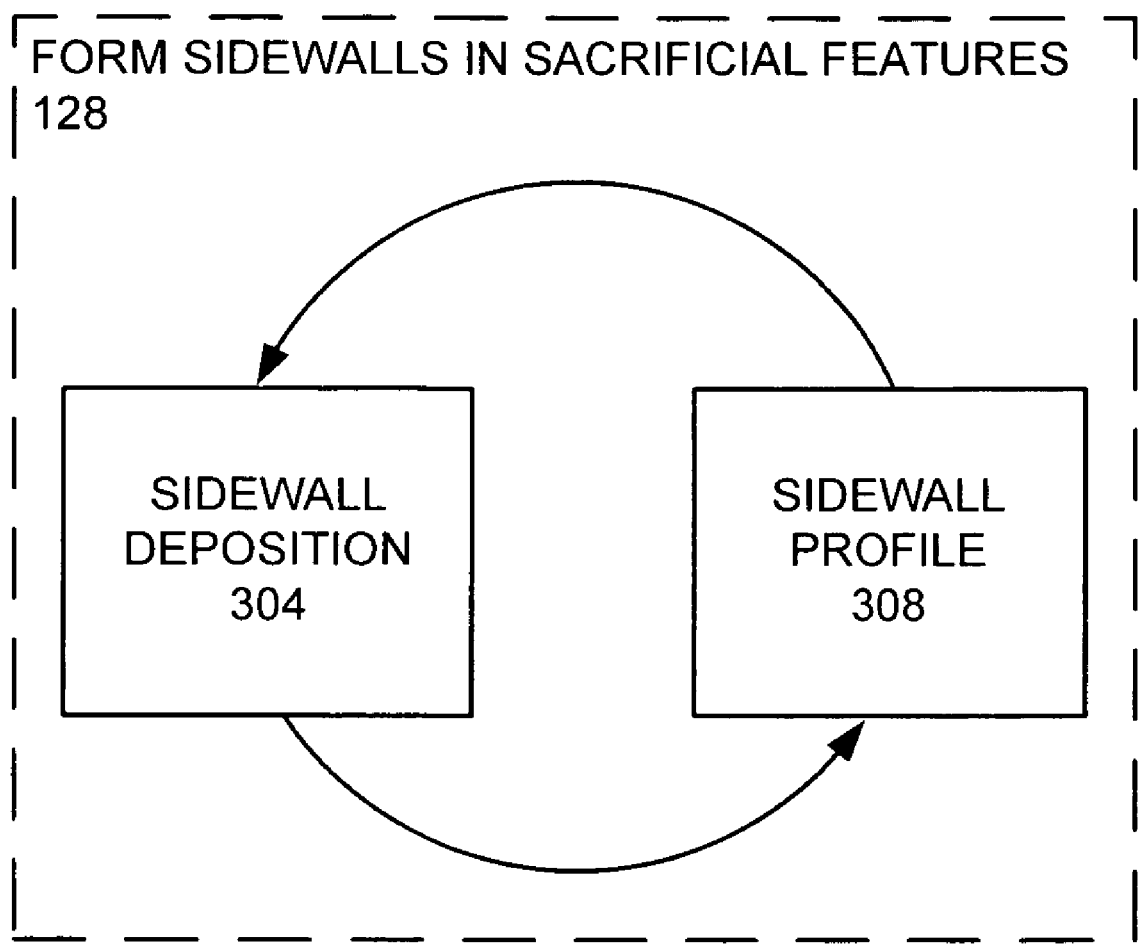
FIG. 3 is a more detailed flow of a step of forming sidewalls.

Sidewalls 230 are formed in the sacrificial features (step 128), as shown in FIG. 2E. FIG. 3 is a more detailed flow chart of the step of forming sidewalls in the sacrificial features (step 128). As shown in FIG. 3, the forming sidewalls in sacrificial features comprises a plurality of cycles of a cyclic process comprising a sidewall deposition phase (step 304) and sidewall profile shaping phase (step 308).

Preferably, the sidewall deposition phase (step 304) uses a deposition gas comprising at least one of SiH4, and other Si-containing gases such as $SiH_2(CH_3)_2$, $SiCl_4$ etc and carrier gases such as He, Ar, Ne, Kr, Xe etc. More preferably, the deposition gas further comprises a carrier gas, such as argon or xenon. More preferably, the deposition gas further comprises at least one of an oxidizing additive and a reducing additive, such as $O_2$, $N_2$, $H_2$, or $NH_3$.

An example of a sidewall deposition phase (step 304) provides a flow of 10 sccm $SiH_4$, and 1000 sccm Ar. The pressure is set to 400 mTorr. The substrate is maintained at a temperature of 20° C. The second RF source 448 provides 400 Watts at a frequency of 27 MHz and 0 Watts a frequency of 2 MHz. During the deposition phase the deposition gas is provided, the deposition gas is transformed into a plasma, and then the deposition gas is stopped.

Preferably, the sidewall profile shaping stage uses a profile shaping gas different from the deposition gas and comprising at least one of $C_xF_y$, and $NF_3$ and HBr, and $Cl_2$. More preferably, the profile shaping gas further comprises a carrier gas, such as argon or xenon. More preferably, the profile shaping gas further comprises at least one of an oxidizing additive and a reducing additive, such as $O_2$, $H_2$, $N_2$, or $NH_3$.

An example of the sidewall profile shaping phase (step 308) provides a halogen (i.e. fluorine, bromine, chlorine) containing gas, such as 100 sccm $CF_4$. In this example, $CF_4$ is the only gas provided during the profile shaping. A pressure of 20 mTorr is provided to the chamber. The second RF source 448 provides 600 Watts at a frequency of 27 MHz and 0 Watts a frequency of 2 MHz. During the profile shaping phase the profile shaping gas is provided, the profile shaping gas is transformed into a plasma, and then the profile shaping gas is stopped.

Preferably, the process is performed between 2 to 20 cycles. More preferably, the process is performed between 3 to 10 cycles. The combination of deposition and profile shaping over a plurality of cycles allows for the formation of vertical sidewalls. Preferably, the vertical sidewalls are sidewalls that from bottom to top make an angle between 88° to 90° with the bottom of the sacrificial layer feature.

Preferably, the sidewalls cause the space between the sacrificial layer features to be reduced by between 5-90%. More preferably, the shrink sidewalls cause the space between the sacrificial layer features to be reduced by between 20-70%. The cyclical cycle may have additional deposition and/or shaping phases or may have other additional phases.

Preferably, the sidewall deposition process does not form a deposition layer along horizontal surfaces. This may be accomplished by allowing some material to deposit during the sidewall deposition phase, but then by having such deposited material removed from horizontal surfaces during the profile shaping phase. By preventing the formation of a deposition layer on a horizontal surface allows for subsequent removal of the sacrificial layer. The sloping surface 228 of the cover 226 is sufficiently sloped from the vertical to prevent sidewall formation on the sloping surface 228. Preferably, the sloping surface 228 is sloped less than 80° from the horizontal or greater than 20° from the vertical.

Figure 2F:
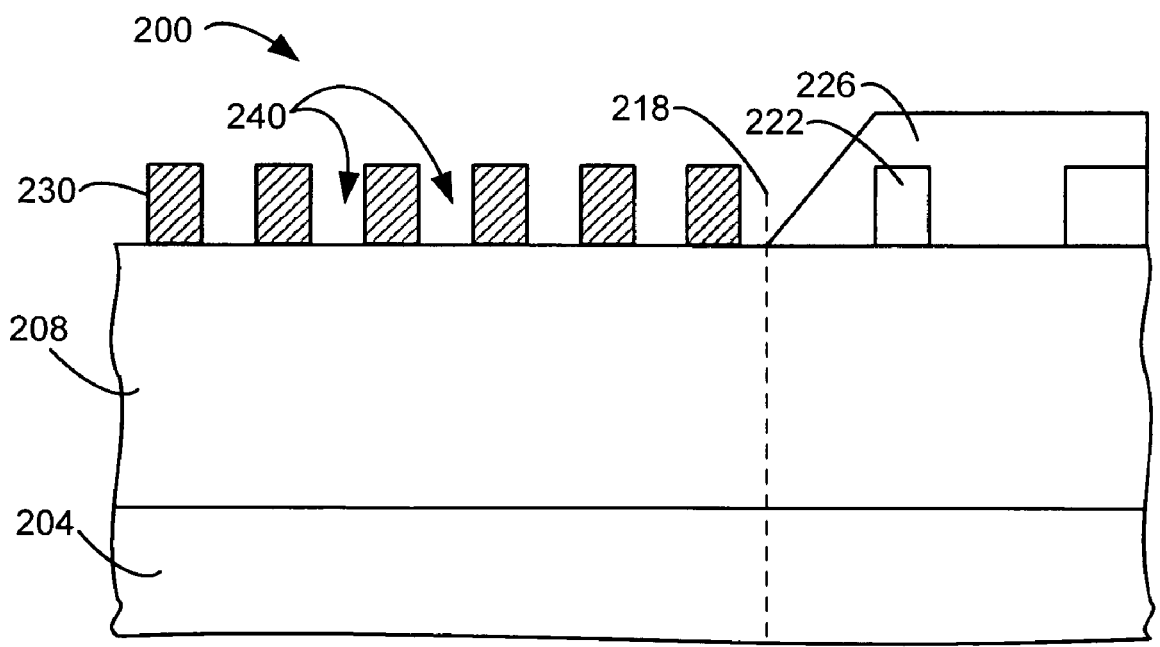

The uncovered part of the sacrificial layer is removed (step 132) so that gaps 240 are formed between the sidewalls where parts of the sacrificial layer were removed, as shown in FIG. 2F. The removal of the sacrificial layer requires an etch that can selectively remove the sacrificial layer material with respect to the sidewalls 230 and the cover 226. In addition, the cover 226 should be much thicker than the sacrificial layer such that enough covering still remaining to protect peripheral areas. An example recipe that is able to do this in this example provides a pressure of 400 mTorr. 200 watts are provides at a frequency of 27 MHz. 2000 sccm of $O_2$ is provided.

Figure 2G:
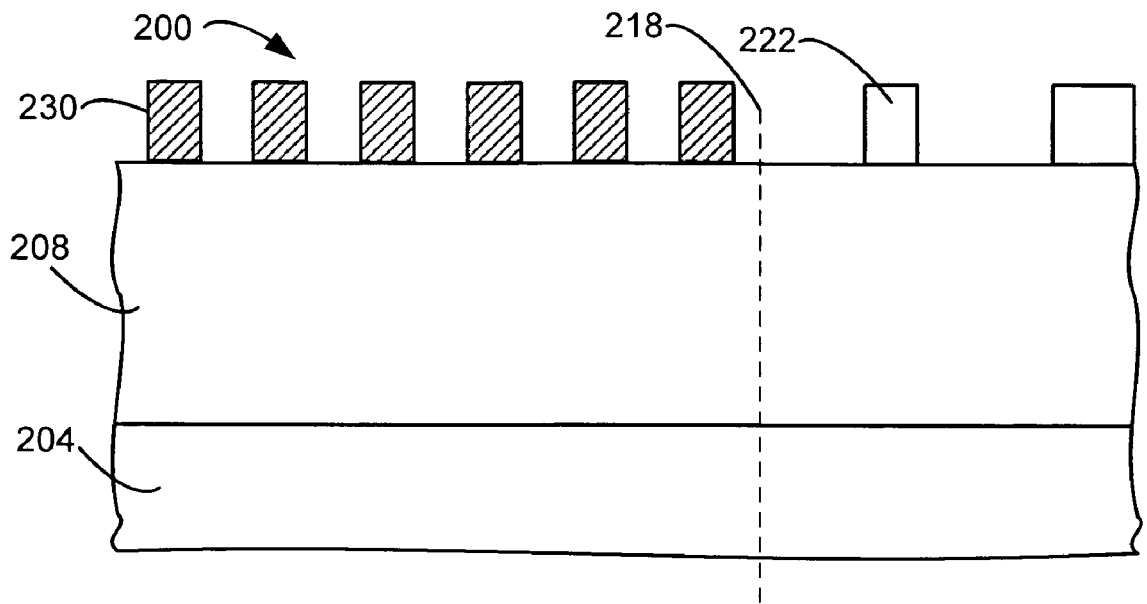

The logic area cover is removed (step 136), as shown in FIG. 2G. A recipe for removing the logic area cover provides a pressure of 20 mTorr. 200 watts are provided at 27 MHz. 200 sccm of $O_2$ are provided. The cover can also be alternatively removed in a wet process.

Figure 2H:
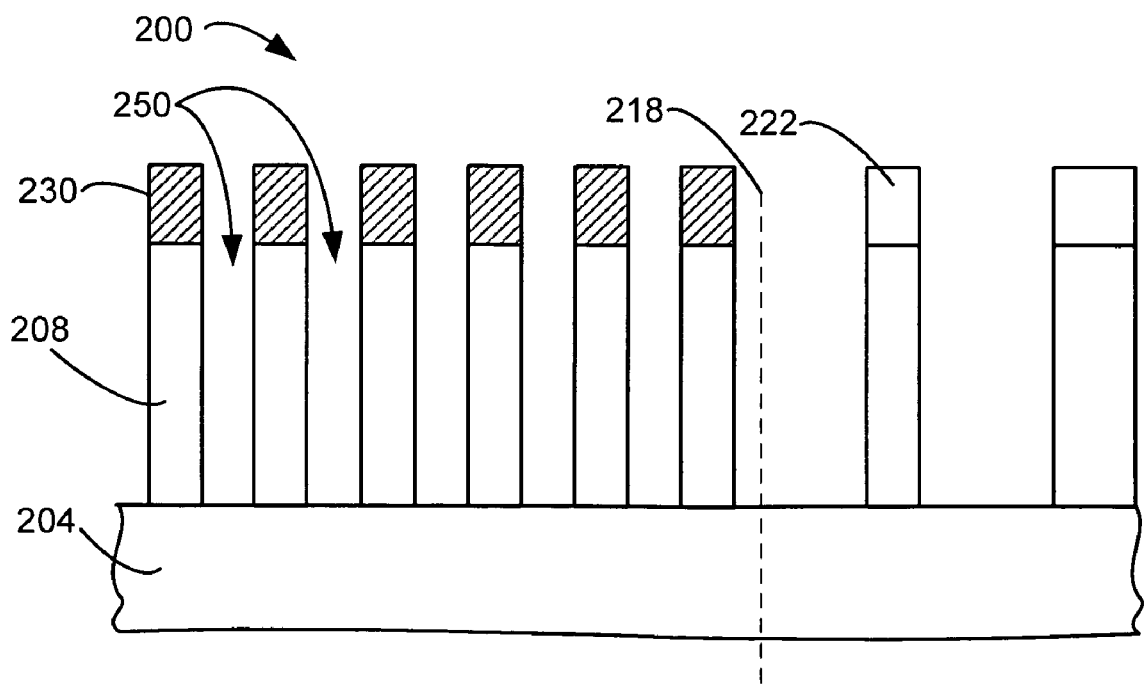

Etch features 250 are etched into the etch layer (step 140), using the sidewalls 230 and the previously covered parts of the sacrificial layer, which formed logic device patterns 222, as an etch mask, as shown in FIG. 2H. A conventional etch recipe for etching the dielectric layer 208 is used.

Figure 2I:
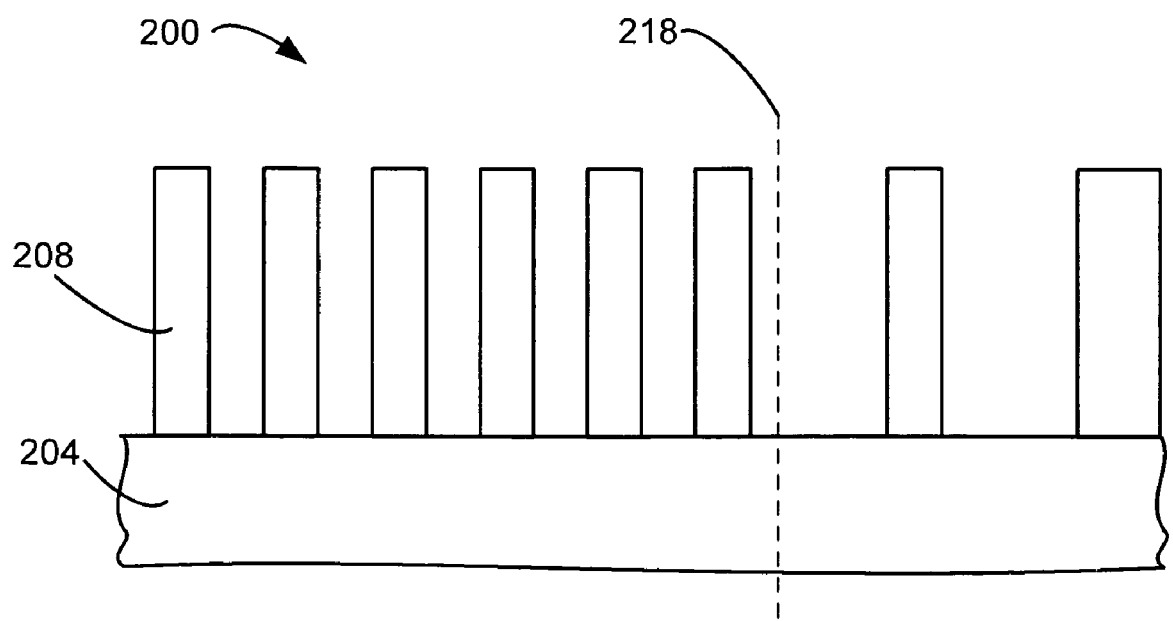

The sidewalls and the previously covered sacrificial layer are removed (step 144), as shown in FIG. 2I. This may be accomplished in a single step that removes both the sidewalls and sacrificial layer in one step or in a plurality of steps that removes the sidewalls in one step and the sacrificial layer in another step. An example of this process is removes the Si-based sidewalls in a halogen containing plasma (HBr, $Cl_2$, $NF_3$ etc) and removes the sacrificial layer (such as an amorphous carbon layer) in an oxidation or reduction plasma of $O_2$, $H_2$, $N_2$, or $NH_3$.

Additional steps may be provided to complete the formation of semiconductor devices.

This process provides etched features with half the CD and half the pitch of features formed using the same photoresist mask using a conventional etch process. This process allows the use of a single photoresist mask and a single etch layer etch to halve the pitch, while providing self alignment of the additional features to the original features.

This process also allows reduction of CD and pitch in a cell or array portion of a memory device where features have the same CD but may or may not be evenly spaced and where CD reduction and pitch doubling is desired, while maintaining CD and pitch in the peripheral logic area of the memory device, where features are irregular and where CD and pitch reduction are not as important and more cumbersome and can be patterned in a low cost manner by the use of older generation lithography method.

The sidewalls are of a material that can be conformally deposited using gas modulation (providing a deposition phase and a profile shaping phase) and that allows selective removal of the sacrificial layer without removing the sidewalls and that also allows selective etching of the etch layer with respect to the sidewalls and that allows selective removal of the sidewalls without damaging the etch layer. Preferably, such sidewalls are a silicon based material, which is preferably silicon. The use of gas modulation to form the sidewalls allows the sidewalls to be formed at a temperature less than 100° C., which reduces device damage and makes it possible to work with photoresist materials to form a cover mask, sacrificial layer or even as the layer to be patterned.

Some of the steps in the above preferred embodiment may be omitted or changed without increasing CD and/or increasing the pitch. Other steps in the preferred embodiment may be omitted or changed, providing an embodiment that still reduces the CD and/or reduces pitch with respect to conventional processes. For example, in another embodiment of the invention, a photoresist mask may be used as a sacrificial layer. In such an embodiment, a mask is not placed over the photoresist mask. Instead, the photoresist mask is trimmed and then sidewalls are formed in the photoresist features. The photoresist mask in the cell or array portion is removed. The etch layer is then etched through the remaining sidewalls. It has been found that the use of a separate sacrificial layer over which a photoresist mask is placed provides better results, and therefore is preferred.

By allowing the use of older generation photoresist, which may be harder than newer generation photoresists and, by using a single mask, the invention allows for a reduction in wiggling. Older generation photoresists also allow a thicker photoresist mask, which allows deeper etching of the sacrificial layer.

In one embodiment, the sequence discussed above can be repeated to further reduce the CD and pitch of the mask features even more. For example, after reducing the pitch of the original features to half, the resulting halved-pitch mask can be subsequently used to pattern a layer of sacrificial materials and the sequence of forming the sidewalls and removing sacrificial layer can be removed to resulting in features of ¼ of the original pitch. The sequence may be repeated even more should it be desired.

Figure 6:
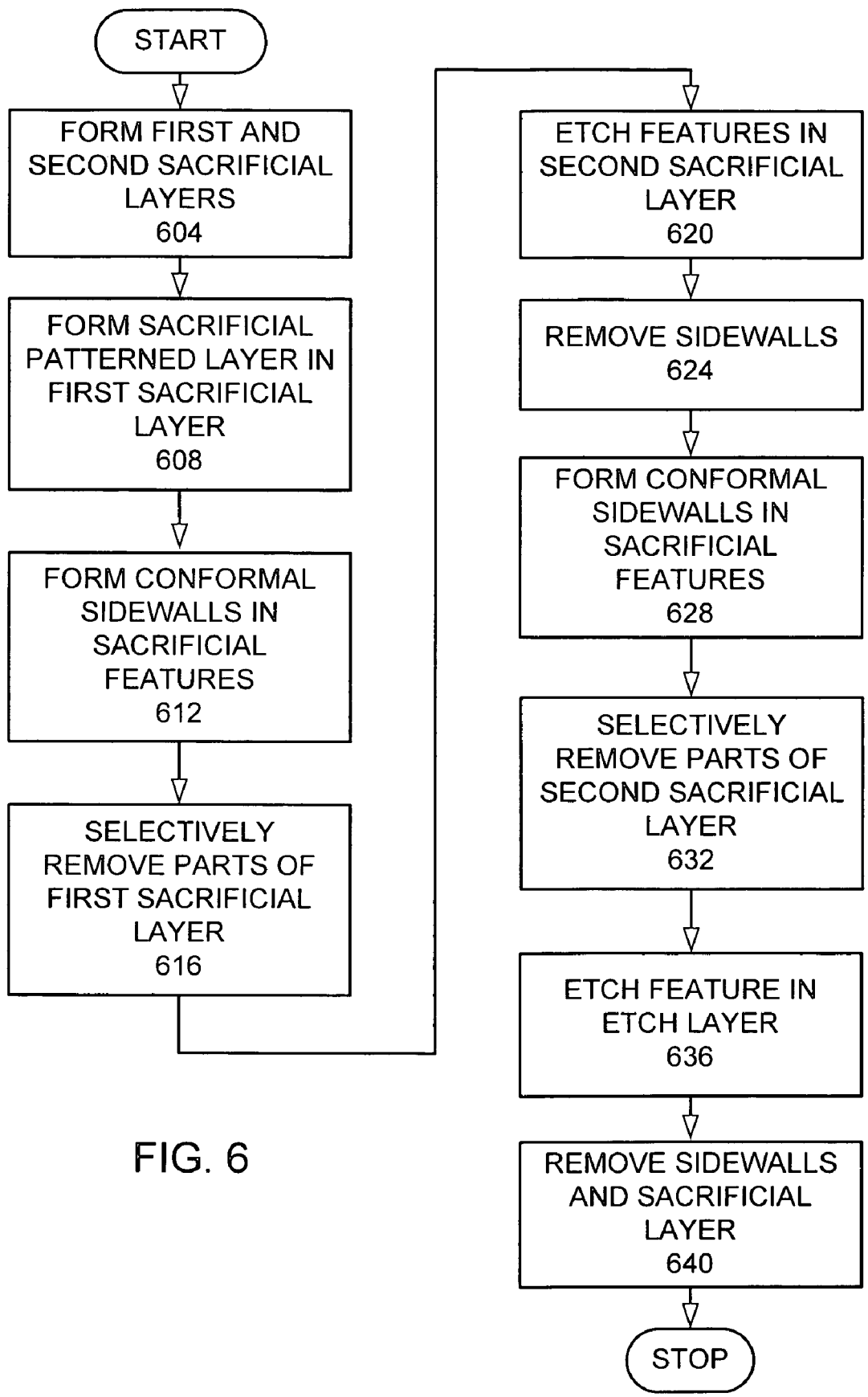
FIG. 6 is a flow chart of another embodiment of the invention, which repeats the process to further, reducing the CD.
Figure 7A:
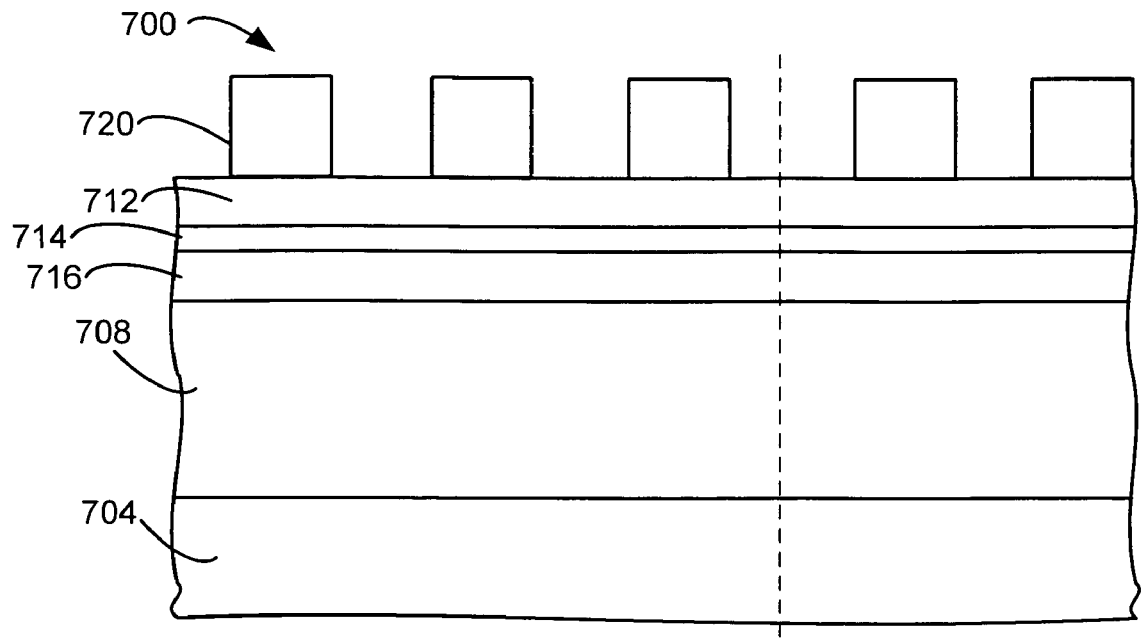
FIGS. 7A-L are schematic cross-sectional and top views of a stack processed according to the embodiment of FIG. 6.

FIG. 6 is a flow chart of an embodiment of the invention which repeats the process to further reduce the CD. First and second sacrificial layers are formed. FIG. 7A is a cross-sectional view of a substrate 704, such as a wafer, over which an etch layer 708 is disposed. A first sacrificial layer 712 and a second sacrificial layer 716 are formed over the etch layer (step 604), with an etch stop layer 714 disposed between the first sacrificial layer 712 and the second sacrificial layer 716. The first and second sacrificial layers 712, 716 are of hardmask materials such as amorphous carbon. The etch stop layer 714 is made of an etch stop material such as SiO2, SiN, SiC.

Figure 7B:
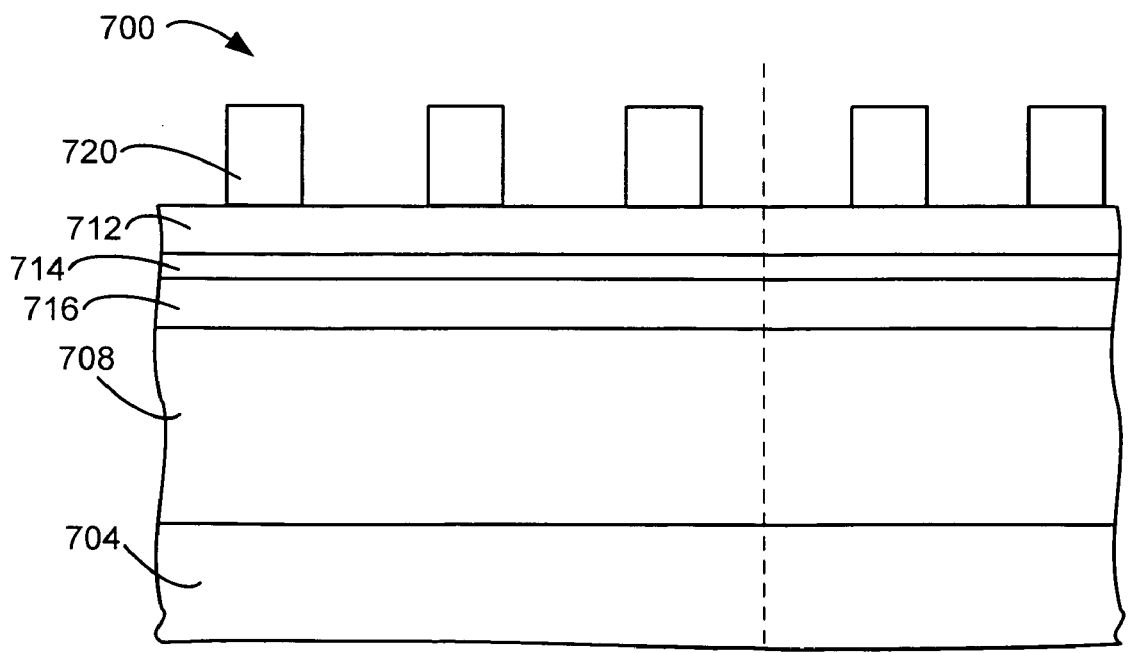
Figure 7C:
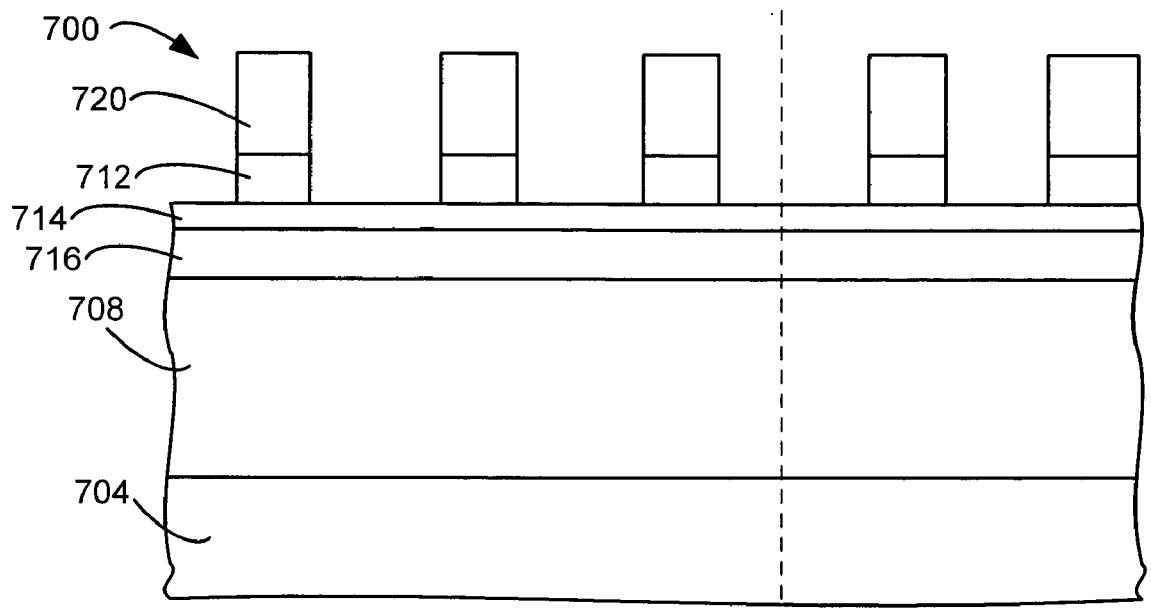
Figure 7D:
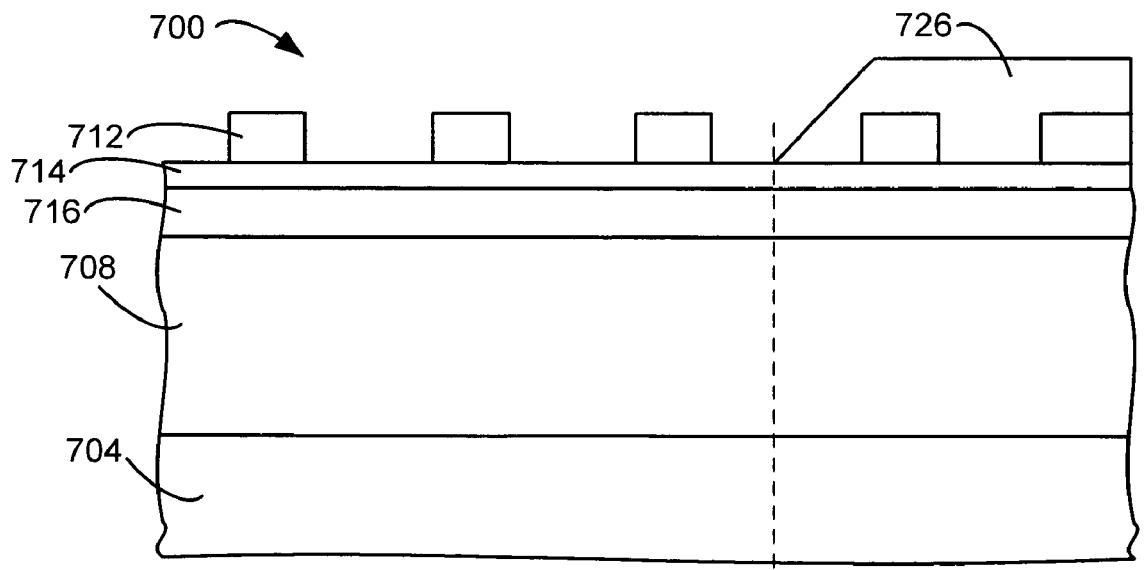

A sacrificial patterned layer is formed in the first sacrificial layer (step 608). In this example a process, similar to the process described in the previous embodiment may be used to form the sacrificial patterned layer. A mask 720, such as a photoresist mask is formed over the first sacrificial layer 712. The mask 720 is trimmed, as shown in FIG. 7B. The first sacrificial layer 712 is etched to form a sacrificial patterned layer in the first sacrificial layer 712, as shown in FIG. 7C. The photoresist mask 720 is removed, as shown in FIG. 7D. A cover 726 is formed over a logic area.

Figure 7E:
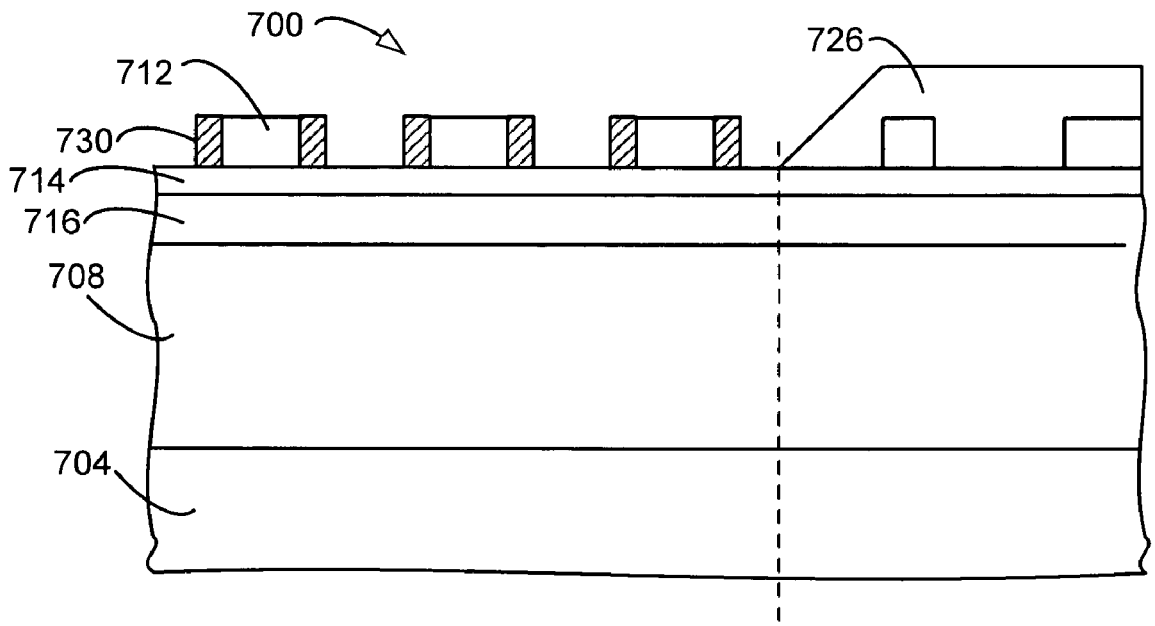

Conformal sidewalls 730 are formed in sacrificial features of the sacrificial patterned layer 712 (step 612), as shown in FIG. 7E. The conformal sidewalls are formed by a deposition process comprising a plurality of cycles of a sidewall deposition phase and a sidewall profile shaping phase.

Figure 7F:
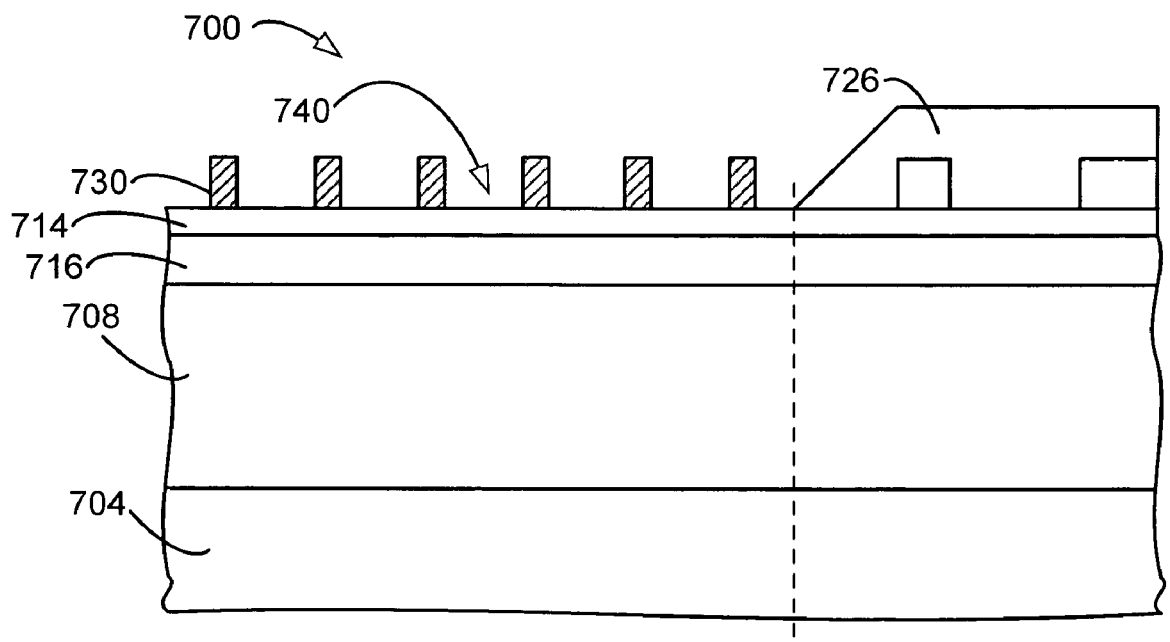
Figure 7G:
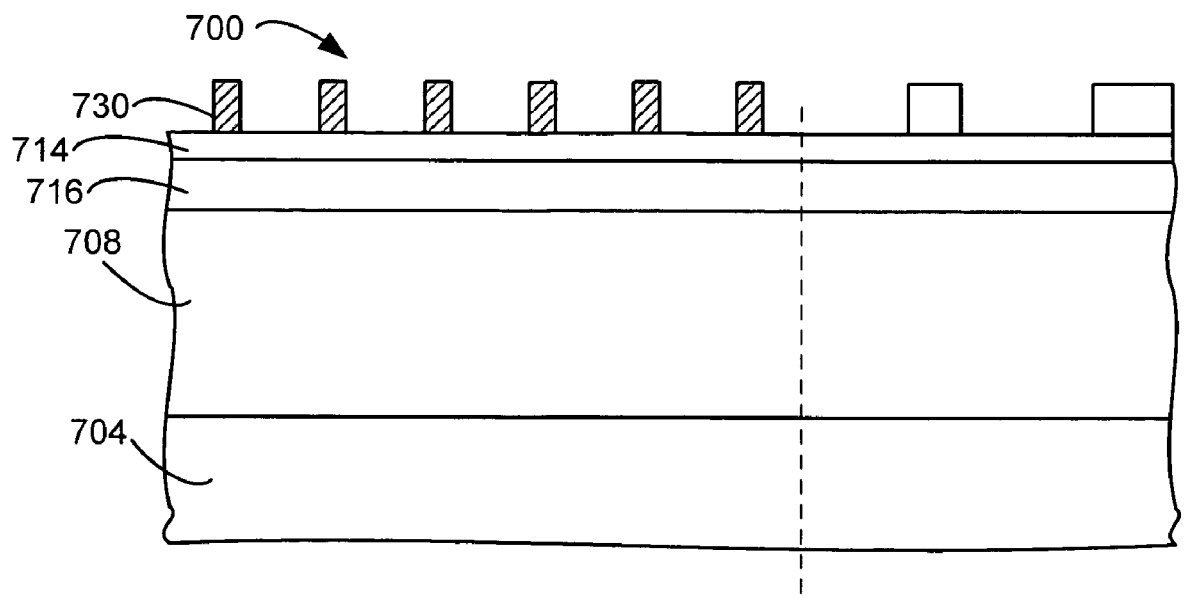

Parts of the first sacrificial layer that are exposed and form the patterned layer are selectively removed leaving gaps 740 between the conformal sidewalls 730 (step 616) where the sacrificial layer once was, as shown in FIG. 7F. The cover is removed, as shown in FIG. 7G.

Figure 7H:
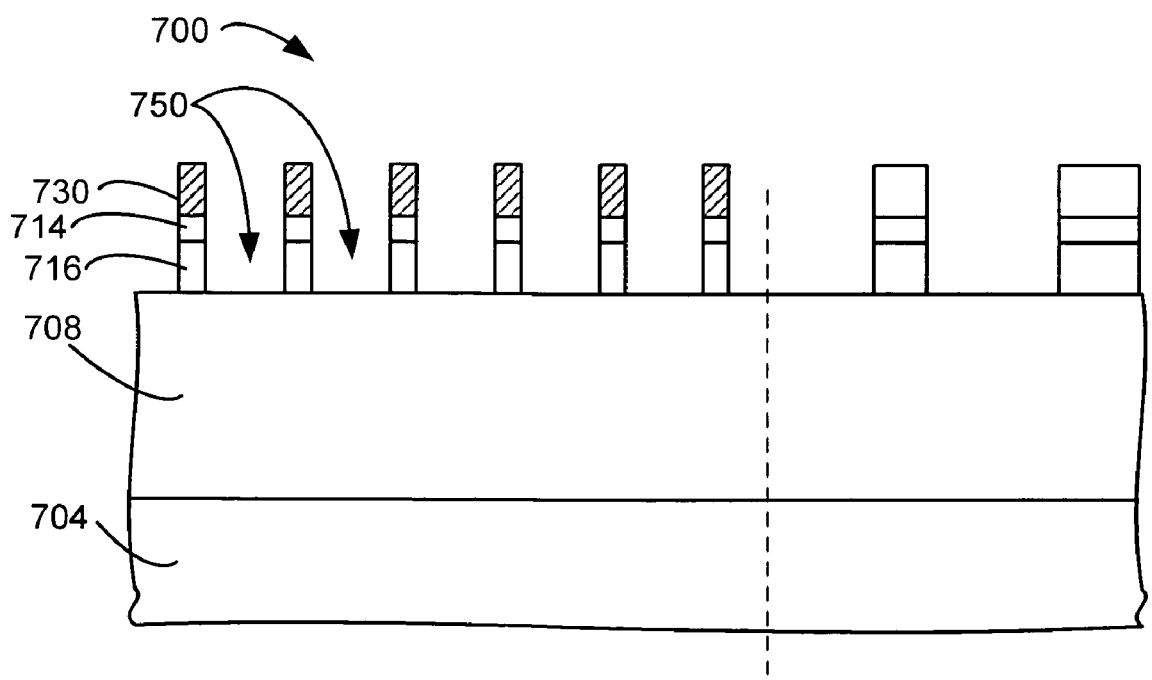

Features 750 are etched through the etch stop layer 714 into the second sacrificial layer 708 (step 620), as shown in FIG. 7H. Because the conformal sidewalls 730 are of a different material than the second sacrificial layer 708, the second sacrificial layer 708 may be selectively etched with respect to the conformal sidewalls 730.

Figure 7I:
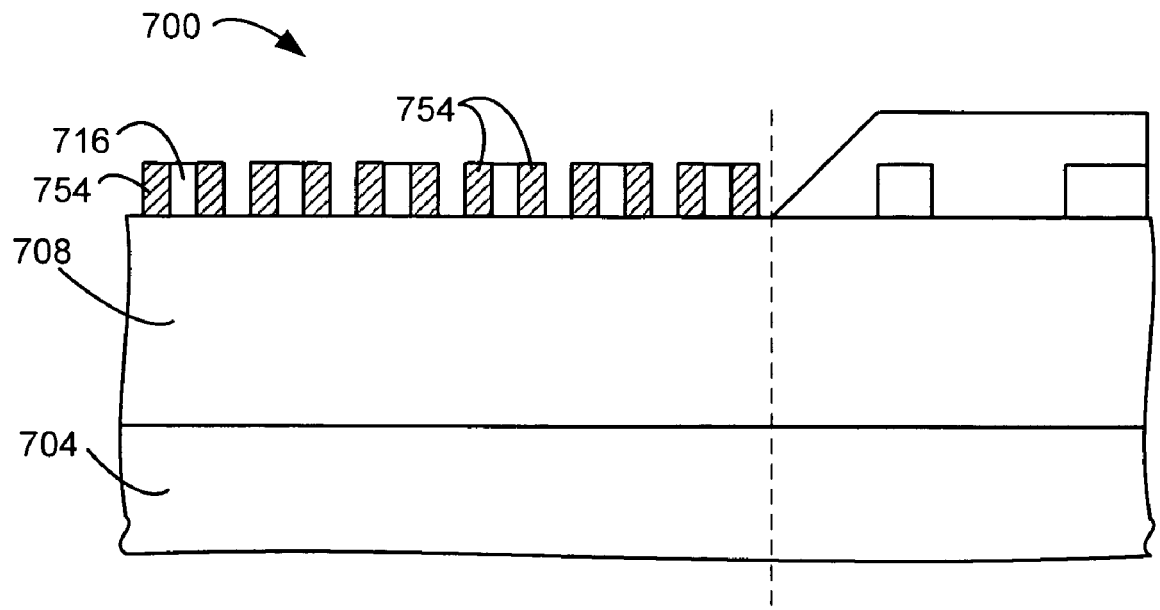

The conformal sidewalls are removed (step 624), as shown in FIG. 7I. A cover is formed over the logic area. A second set of conformal sidewalls 754 are formed in features of the second sacrificial layer (step 628). In this example, the second set of conformal sidewalls 754 are formed by a deposition process comprising a plurality of cycles of a sidewall deposition phase and a sidewall profile shaping phase.

Figure 7J:
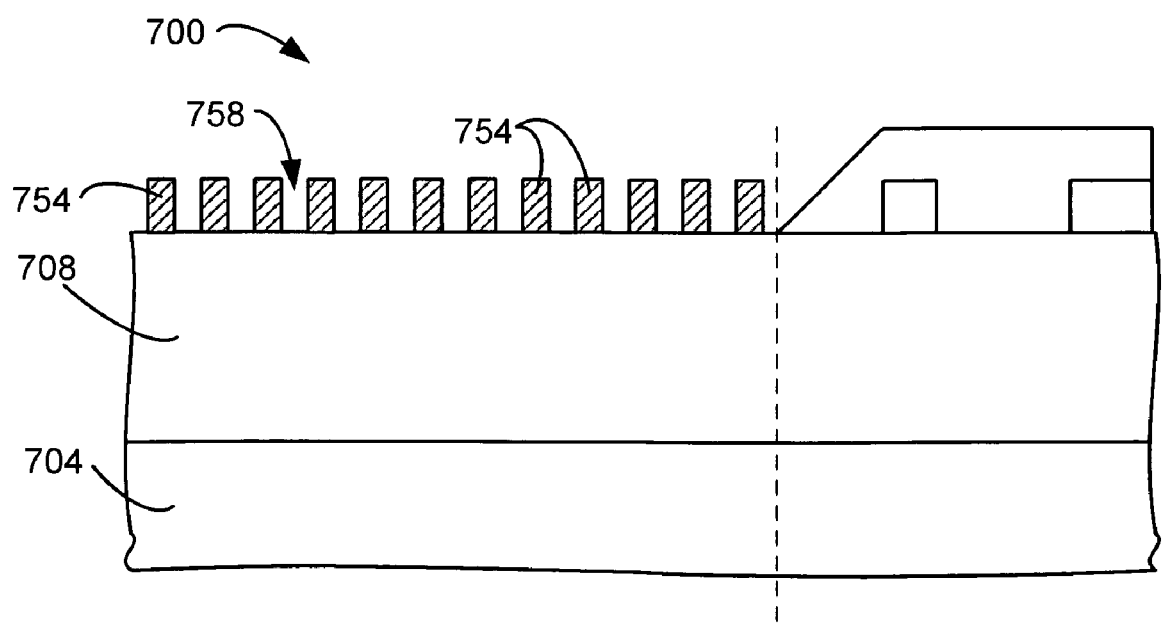
Figure 7K:
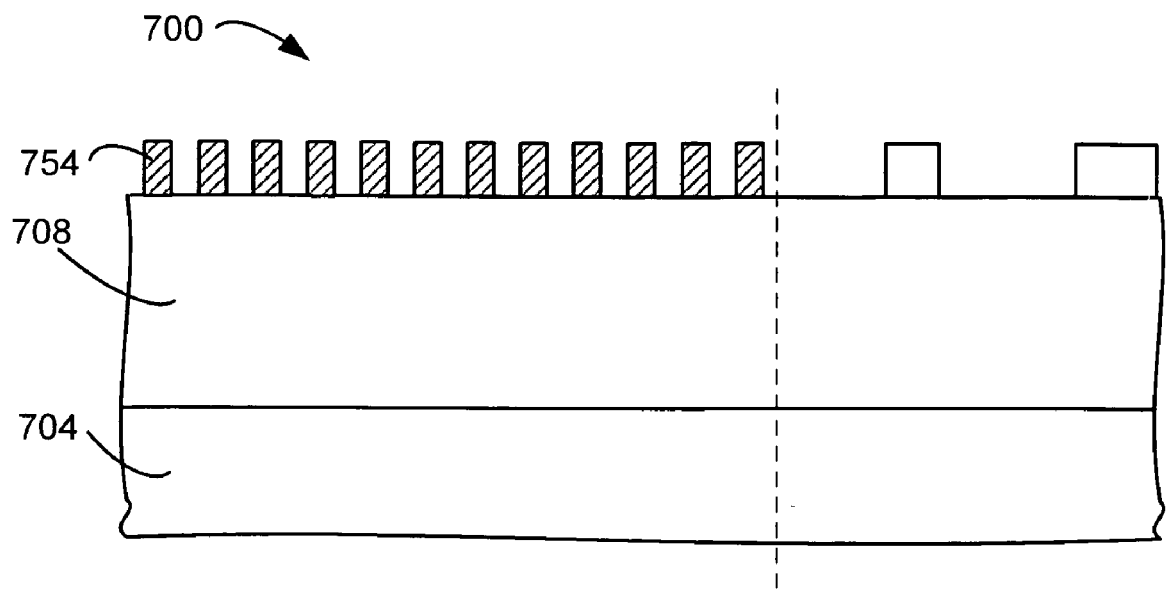
Figure 7L:
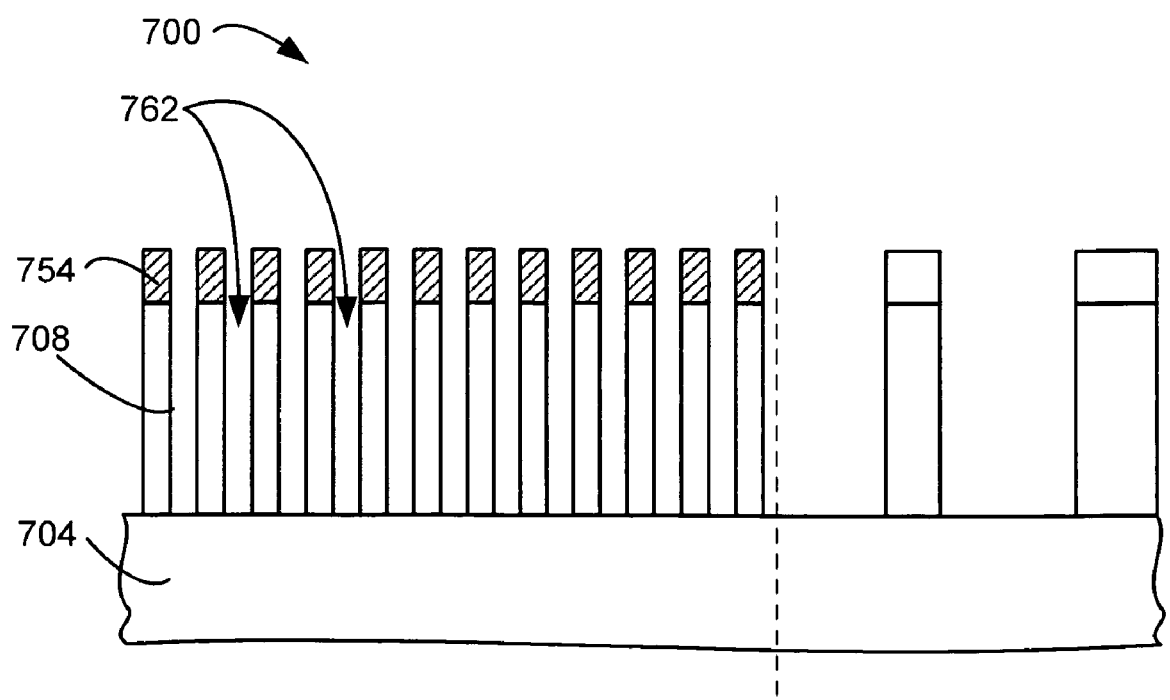

Parts of the second sacrificial layer that are exposed are selectively removed leaving gaps 758 between the conformal sidewalls 754 (step 632) where the sacrificial layer once was, as shown in FIG. 7J. The cover over the logic area is removed, as shown in FIG. 7K. Etch features 762 are etched into the etch layer 708 (step 636), as shown in FIG. 7L. Further processing such as the removal of the sidewalls 754 (step 640) may be performed.

Other embodiments using multiple sets of conformal sidewalls may be used. For example, a single sacrificial layer may be used. A second set of sidewalls may be formed on the sidewalls of the first set of sidewalls, where the second set of sidewalls are of a different material than the first set of sidewalls, which allows the first set of sidewalls to be selectively removed with respect to the second set of sidewalls.

The above embodiment and other possible embodiments allow multiple iterations to further reduce CD using a single lithography step. Each subsequent iteration is self aligned with the previous iteration, so that each iteration does not require a lithography step, which reduces the required precision of the lithography process.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for providing features in an etch layer, comprising:
   forming a sacrificial patterned layer with sacrificial features over an etch layer;
   forming conformal sidewalls in the sacrificial features, comprising at least two cycles of a sidewall formation process, wherein each cycle comprises:
      a sidewall deposition phase; and
      a sidewall profile shaping phase, which shapes the sidewall profile to a vertical profile;
   selectively removing parts of the sacrificial patterned layer between conformal sidewalls leaving the conformal sidewalls with gaps between the conformal sidewalls where parts of the sacrificial patterned layer were selectively removed; and
   etching features in the etch layer using the conformal sidewalls as an etch mask, wherein the features in the etch layer are etched through the gaps between the conformal sidewalls where parts of the sacrificial patterned layer were selectively removed.

2. The method, as recited in claim 1, wherein the sidewall deposition phase comprises:
   providing a deposition gas;
   forming a plasma from the deposition gas; and
   stopping the flow of the deposition gas.

3. The method, as recited in claim 2, wherein the sidewall profile shaping phase comprises:
   providing a profile shaping gas different than the deposition gas;
   forming a plasma from the profile shaping gas; and
   stopping the flow of the profile shaping gas.

4. The method, as recited in claim 3, wherein the forming the sacrificial patterned layer, comprises:
   forming a sacrificial layer over the etch layer;
   forming a patterned mask over the sacrificial layer; and
   etching sacrificial features into the sacrificial layer.

5. The method, as recited in claim 4, wherein the patterned mask is a photoresist mask, and wherein the forming the sacrificial patterned layer further comprises trimming the photoresist mask.

6. The method, as recited in claim 5, wherein the forming the sacrificial patterned layer further comprises removing the photoresist mask after etching sacrificial features into the sacrificial layer.

7. The method, as recited in claim 6, wherein the sacrificial patterned layer defines an array region and a logic region, further comprising covering the logic region of the sacrificial patterned layer after forming the sacrificial patterned layer, wherein the selectively removing parts of the sacrificial patterned layer removes uncovered parts of the sacrificial patterned layer.

8. The method, as recited in claim 7, further comprising uncovering the logic region of the sacrificial patterned layer after selectively removing parts of the sacrificial patterned layer.

9. The method, as recited in claim 8, further comprising removing the sidewalls and remaining parts of the sacrificial patterned layer.

10. The method, as recited in claim 9, wherein the sidewalls are of deposited silicon.

11. The method, as recited in claim 10, wherein the sidewalls have a substantially vertical slope.

12. The method, as recited in claim 1, wherein the forming the patterned sacrificial layer comprises:
   forming a photoresist layer over the etch layer;
   patterning the photoresist layer to form a patterned photoresist mask, wherein the patterned photoresist mask is the patterned sacrificial layer and wherein the conformal sidewalls are formed on the photoresist mask.

13. The method, as recited in claim 3, wherein the forming the sacrificial patterned layer, comprises:
   forming a first sacrificial layer, second sacrificial layer, and etch stop stack, comprising:
      forming the second sacrificial layer over the etch layer;
      forming an etch stop layer over the second sacrificial layer; and
      forming the first sacrificial layer over the etch stop layer;
   forming a patterned mask over the first sacrificial layer;
   etching sacrificial features into the first sacrificial layer;

forming conformal sidewalls in the sacrificial features of the first sacrificial layer;

selectively removing parts of the first sacrificial layer between the conformal sidewalls leaving the conformal sidewalls with gaps between the conformal sidewalls where parts of the first sacrificial layer where removed;

etching features into the second sacrificial layer to form the sacrificial patterned layer; and removing the conformal sidewalls.

14. The method, as recited in claim 1, wherein the forming the sacrificial patterned layer, comprises:

forming a photoresist mask over the sacrificial layer; and trimming the photoresist mask, wherein the photoresist mask is the sacrificial, and wherein the conformal sidewalls are formed on the photoresist mask.

15. The method, as recited in claim 1, wherein the sacrificial patterned layer defines an array region and a logic region, further comprising:

covering the logic region of the sacrificial patterned layer after forming the sacrificial patterned layer, wherein the selectively removing parts of the sacrificial patterned layer removes uncovered parts of the sacrificial patterned layer; and uncovering the logic region of the sacrificial patterned layer after selectively removing parts of the sacrificial patterned layer.

16. The method, as recited in claim 1, wherein the forming conformal sidewalls does not form a deposition along horizontal surfaces.

17. A method for providing features in an etch layer, comprising:

forming a sacrificial patterned layer with sacrificial features over an etch layer, wherein the sacrificial patterned layer defines an array region and a logic region, comprising, providing a photoresist layer; and forming a photoresist mask from the photoresist layer, wherein the sacrificially patterned layer is the photoresist mask;

covering the logic region of the sacrificial patterned layer, wherein parts of the sacrificial patterned layer defining the array region are uncovered;

forming conformal sidewalls in the sacrificial features wherein the sidewall are on the photoresist mask, comprising at least two cycles of a sidewall formation process, wherein each cycle comprises:

a sidewall deposition phase, comprising:

providing a deposition gas;

forming a plasma from the deposition gas; and stopping the flow of the deposition gas; and a sidewall profile shaping phase, which shapes the sidewall profile to a vertical profile, comprising:

providing a profile shaping gas different than the deposition gas;

forming a plasma from the profile shaping gas; and stopping the flow of the profile shaping gas;

selectively removing uncovered parts of the sacrificial patterned layer between conformal sidewalls leaving the conformal sidewalls with gaps between the conformal sidewalls where parts of the sacrificial patterned layer were selectively removed;

uncovering the logic region of the sacrificial patterned layer; and etching features in the etch layer using the conformal sidewalls as an etch mask, wherein the features in the etch layer are etched through the gaps between the conformal sidewalls where parts of the sacrificial patterned layer were selectively removed.

18. The method, as recited in claim 17, wherein the forming the sacrificial patterned layer, further comprises trimming the photoresist mask.

19. The method, as recited in claim 11, wherein the conformal sidewalls from bottom to top make an angle between 88° to 90° with the bottom of the sacrificial layer feature.

20. The method, as recited in claim 1, wherein the conformal sidewalls are formed at a temperature less than 100° C.

* * * * *